United States Patent [19]

Watanabe

[11] Patent Number: 5,324,947
[45] Date of Patent: Jun. 28, 1994

[54] ENERGY-DISPERSIVE X-RAY DETECTOR AND METHOD OF EVACUATING SAME

[75] Inventor: Eiichi Watanabe, Tokyo, Japan

[73] Assignee: JEOL Ltd., Tokyo, Japan

[21] Appl. No.: 986,688

[22] Filed: Dec. 8, 1992

[30] Foreign Application Priority Data

Dec. 9, 1991 [JP] Japan .................................. 3-324507

[51] Int. Cl.$^5$ ........................ G01T 1/24; H01J 37/26
[52] U.S. Cl. .............................. 250/370.15; 62/55.5; 250/310
[58] Field of Search .............. 250/310, 397, 370.15; 62/55.5

[56] References Cited

U.S. PATENT DOCUMENTS

| | | | |
|---|---|---|---|
| 3,609,992 | 10/1971 | Cacheux | 250/370.15 |
| 3,864,570 | 2/1975 | Zingaro | 250/310 |
| 4,230,945 | 10/1980 | Mein et al. | 250/370.15 |
| 4,931,650 | 6/1990 | Lowe et al. | 250/370.15 |
| 5,065,029 | 11/1991 | Krivanek | 250/310 |
| 5,075,555 | 12/1991 | Woldseth et al. | 250/370.15 |
| 5,163,297 | 11/1992 | Yani et al. | 250/352 |
| 5,212,953 | 5/1993 | Kawaguchi et al. | 250/370.15 |

OTHER PUBLICATIONS

David D. Cohen, *X-Ray Spectrometry*, vol. 16, pp. 237-241 (1987), "Ice Thickness and Low-Energy Si(Li) Detector Efficiency Measurements".

*Primary Examiner*—Bruce C. Anderson
*Attorney, Agent, or Firm*—Webb Ziesenheim Bruening Logsdon Orkin & Hanson

[57] ABSTRACT

An energy-dispersive x-ray detector designed so that the space accommodating an x-ray detector device can be evacuated well and efficiently. When the detector device is not in use, a control portion stops the operation of a compressor and the operation of a refrigerator. Then, the temperature of an adsorbent rises. Gas which has been once adsorbed is released into the space, thus deteriorating the degree of vacuum. If the x-ray detector is instructed to operate via a console portion, the control portion operates a vacuum pump and opens an exhaust valve to evacuate the inside of the space. When the output signal from a vacuum gauge indicates that the degree of vacuum inside the space has reached a given level, the control portion closes the exhaust valve, stops the operation of the vacuum pump, and starts the operation of the compressor. As a result, the adsorbent is cooled. Then, the inside of the space is maintained at a desired degree of vacuum.

4 Claims, 1 Drawing Sheet

ENERGY-DISPERSIVE X-RAY DETECTOR AND METHOD OF EVACUATING SAME

FIELD OF THE INVENTION

The present invention relates to an x-ray detector for use in an energy-dispersive x-ray spectrometer (EDS) and, more particularly, to a structure for well maintaining the degree of vacuum in the space in which an x-ray detector device is mounted. Also, the invention relates to a method of evacuating the inside of this structure.

BACKGROUND OF THE INVENTION

In an EDS, the space in which the x-ray detector device is placed is required to be maintained as a high vacuum. For this purpose, an adsorbent such as active carbon is cooled by liquid nitrogen. The gas inside the space is adsorbed by the adsorbing action the adsorbent to maintain the degree of vacuum.

In the prior art EDS. as the temperature of the adsorbent rises, the gas adsorbed on the adsorbent released into the space in which the x-ray detector device is installed. Therefore, even when the EDS is not in use, depletion of the liquid nitrogen is not permitted. Consequently, liquid nitrogen must be frequently replenished. In this way, maintenance involves a problem. Furthermore, there is a danger in treating liquid nitrogen.

It is contemplated to use a refrigerator as a means for cooling adsorbent It is expected that the aforementioned problems are solved by this means. However, the space in which the x-ray detector device is placed is normally closed. Therefore, if the operation of the refrigerator is stopped when the EDS is not in use, the temperature of the adsorbent rises. Then, gas which is once adsorbed is released into the space, thus deteriorating the degree of vacuum. Thus, in this system where the adsorbent is cooled by the refrigerator, it is necessary to operate the refrigerator incessantly. In consequence, the components of the refrigerator wear away quickly. As a result, components must be replaced frequently. Also, heat storage materials must be exchanged often.

SUMMARY OF THE INVENTION

It is an object of the present invention to provide an energy-dispersive x-ray spectrometer (EDS) detector which is easy to maintain and permits the space accommodating an x-ray detector device to be evacuated well and efficiently.

It is another object of the invention to provide a method of evacuating the space accommodating an x-ray detector device well and efficiently.

An energy-dispersive x-ray detector according to the present invention comprises: an x-ray detector device; a refrigerator having a head in which an adsorbent is disposed; a heat transfer rod disposed between the x-ray detector device and the head of the refrigerator; a protective container in which the x-ray detector device, the head of the refrigerator, and the heat transfer rod are housed; and a pumping system connected with the protective container via exhaust pipes and an exhaust valve.

A method according to the invention is carried out to evacuate an energy-dispersive x-ray detector comprising: an x-ray detector device; a refrigerator having a head containing an adsorbent; a heat transfer rod disposed between the x-ray detector device and the head of the refrigerator; a protective container housing the x-ray detector device, the head of the refrigerator, and the heat transfer rod; and a pumping system connected with the protective container via exhaust pipes and an exhaust valve. When the x-ray detector device is not in use, the refrigerator is not operated. When the x-ray detector device is in use, the inside of the protective container is evacuated by the pumping system. Also, the refrigerator is operated to maintain the vacuum inside the protective container.

Another method according to the invention is carried out to evacuate an energy-dispersive x-ray detector comprising: an x-ray detector device; a refrigerator having a head containing an adsorbent; a heat transfer rod disposed between the x-ray detector device and the head of the refrigerator; a protective container housing the x-ray detector device, the head of the refrigerator, and the heat transfer rod; exhaust pipes connecting the specimen chamber in an electron microscope with the protective container, the x-ray detector device being installed in the specimen chamber; and an exhaust valve. When the x-ray detector device is not in use, the refrigerator is not operated. When the x-ray detector device is in use, the inside of the protective container is evacuated by a pumping system which also evacuates the inside of the specimen chamber in the electron microscope. The vacuum created inside the protective container is maintained by operating the refrigerator.

An energy-dispersive x-ray detector according to the invention comprises an x-ray detector device, a refrigerator having a head containing an adsorbent, a heat transfer rod, a protective container, and a pumping system. The heat transfer rod is disposed between the x-ray detector device and the head of the refrigerator. The protective container houses the x-ray detector device, the head of the refrigerator, and the heat transfer rod. The pumping system is connected with the protective container via exhaust pipes and an exhaust valve.

When the x-ray detector device is not in use, the refrigerator is not operated. When the operation of the refrigerator is stopped, the temperature of the adsorbent rises, releasing gas. Before the x-ray detector device is used, the released gas is evacuated by the pumping system. Then, the refrigerator is operated to cool the adsorbent, thus adsorbing the gas. Therefore, the space inside the protective container is maintained at a good degree of vacuum.

Where an x-ray detector device is mounted in an electron microscope, a pumping system which evacuates the body of the microscope acts also to evacuate the inside of the protective container. Also in this case, when the x-ray detector device is not in use, the refrigerator is not operated. When the x-ray detector device should be used, the pumping system for the body of the microscope evacuates the gas inside the protective container. Then, the refrigerator is operated to cool the adsorbent. As a result, the gas is adsorbed. Consequently, the space in the protective container is maintained at a high degree of vacuum.

Other objects and features of the invention will appear in the course of the description thereof which follows.

DETAILED DESCRIPTION OF THE INVENTION

Figure 1:
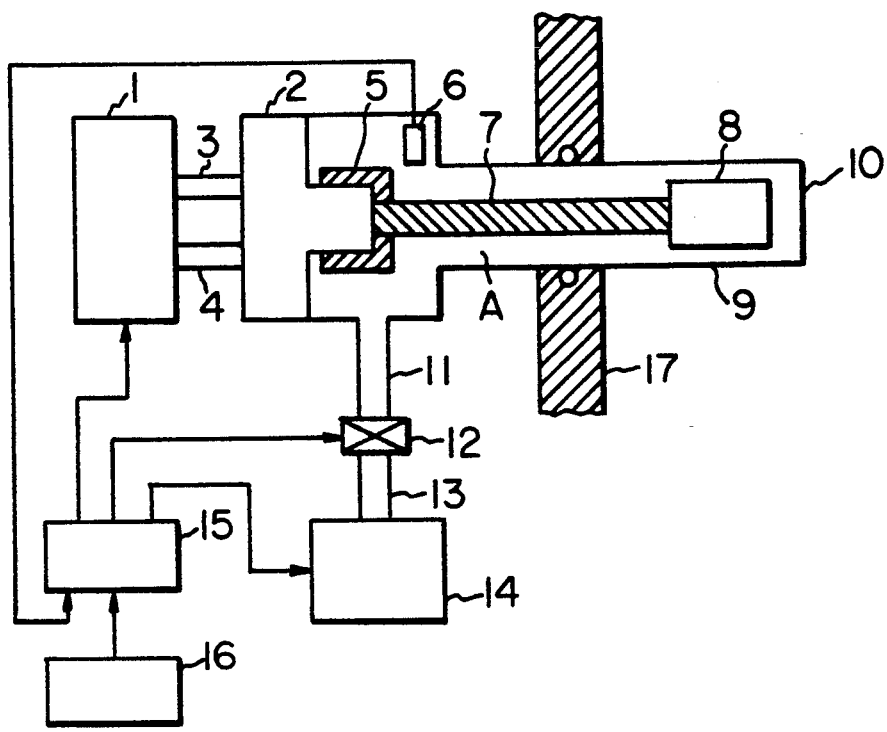
FIG. 1 is a cross-sectional view of a window-type x-ray detector according to the invention.

Referring to FIG. 1, there is shown an x-ray detector of a so-called window type according to the invention. This detector has a window 10 ahead of a semiconductor device 8 for detecting x-rays, the window consisting of a thin film of beryllium or other material. Also shown in this figure are a compressor 1, a refrigerator head 2, connecting pipes 3, 4, an adsorbent 5, a vacuum gauge 6, a heat transfer rod 7, a protective container 9, exhaust pipes 11, 13, an exhaust valve 12, a vacuum pump 14, a control portion 15, a console portion 16, and a vacuum vessel 17.

The compressor 1, the head 2, the connecting pipes 3, 4 together form a refrigerator. The head 2 contains a piston, a cylinder, and so on to permit the refrigerant to adiabatically expand. Since the structure and the operation of this refrigerator are well-known, they are not described herein. The connecting pipe 3 acts to send the refrigerant compressed by the compressor 1 to the head 2. The connecting pipe 4 serves to send the refrigerant adiabatically expanded in the head 2 to the compressor 1.

The adsorbent 5 consisting of active carbon or other material is placed on the outer periphery of the head 2 of the refrigerator. The heat transfer rod 7 is mounted between the refrigerator head 2 and the x-ray detector device 8. The head 2, the adsorbent 5, the x-ray detector device 8, and the heat transfer rod 7 are contained in the protective container 9. The window 10 of a thin film of beryllium is located at the end of the container 9 which is on the side of the detector device 8.

The space A inside the protective container 9 is connected with the vacuum pump 14 via the exhaust pipe 11, the exhaust valve 12, and the exhaust pipe 13. Of course, the vacuum pump 14 can be an independent vacuum pump. In addition, the vacuum pump which evacuates the body of the EDS can act also as the pump 14. Where the x-ray detector device is mounted in an electron microscope, the vacuum pump that evacuates the body of the microscope can act also as the pump 14. In FIG. 1, indicated by 17 is the vacuum vessel of the EDS or of the microscope.

The vacuum gauge 6 is disposed at a given position inside the space A. The output signal from the gauge 6 is supplied to the control portion 15 which comprises a microprocessor and peripheral circuits. The control portion 15 controls the compressor 1 of the refrigerator, the exhaust valve 12, and the vacuum pump 14. Of course, the control portion 15 can be a dedicated unit for performing operations according to the present invention as described below. The control portion 15 can act also as a control portion that processes signals for the operation of the EDS or electron microscope or for analysis. The console portion 16 has buttons and a keyboard for performing various operations on the EDS or the electron microscope.

The operation of the control portion 15 is described next. When the x-ray detector device 8 is not used as encountered when x-ray analysis is not performed, the control portion 15 inhibits the operation of the compressor 1. This stops the operation of the refrigerator. Then, the temperature of the adsorbent 5 rises. The gas once adsorbed is released into the space A, and therefore the degree of vacuum inside the space A drops.

When an instruction for operating the x-ray detector is entered from the console portion 16, the control portion 15 operates the vacuum pump 14 and opens the exhaust valve 12. Thus, the inside of the space A is started to be evacuated. If the control portion 15 subsequently finds from the output signal from the vacuum gauge 6 that the degree of vacuum inside the space A has reached a given degree of vacuum, the control portion 15 closes the exhaust valve 12, stops the operation of the vacuum pump 14, and starts the operation of the compressor 1. In this way, the adsorbent 5 is cooled. Then, the inside of the space A is maintained at a given degree of vacuum. Where the control portion 15 also processes the output signal from the x-ray detector device 8, the control portion 15 does not accept the output signal from the detector device 8 until the output signal from the vacuum gauge 6 indicates that the degree of vacuum inside the space A has reached a given degree of vacuum.

In the above embodiment, it is not necessary to operate the vacuum pump constantly. Hence, the running cost of the vacuum pump is low.

Figure 2:
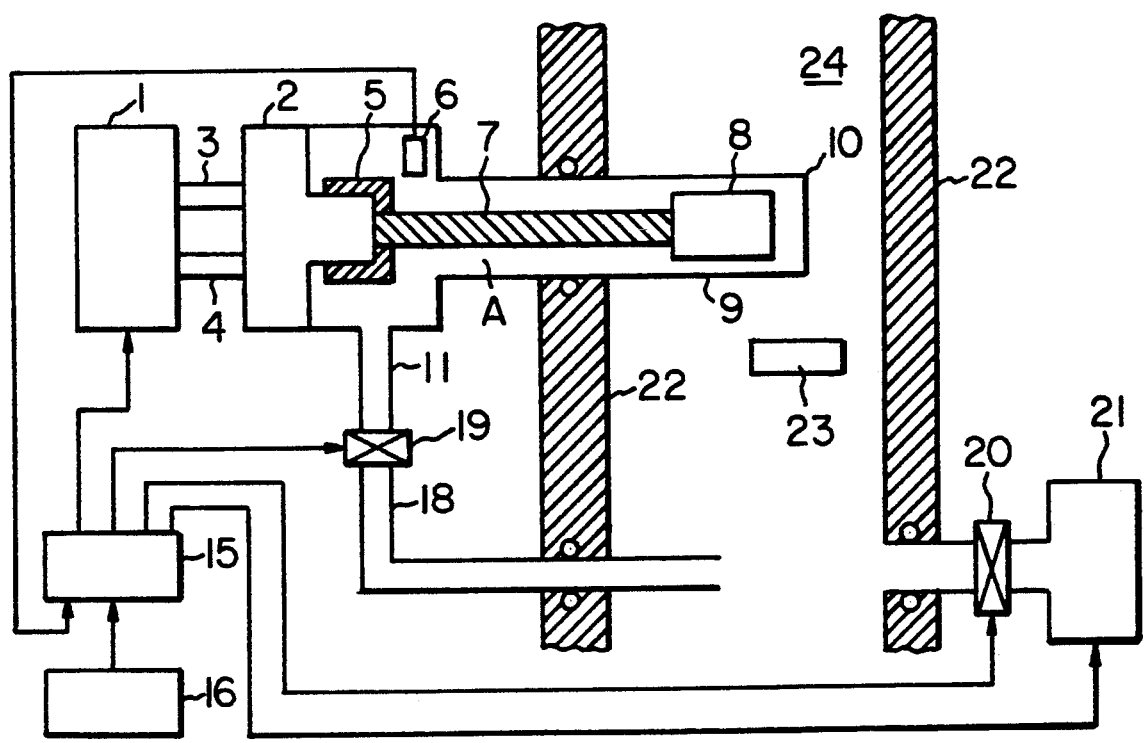
FIG. 2 is a cross-sectional view of another window-type x-ray detector according to the invention.

FIG. 2 shows another embodiment of the invention. In this embodiment, an x-ray detector device is mounted in an electron microscope. Any separate vacuum pump for evacuating the protective container is not provided; the protective container is evacuated by a vacuum pump which also evacuates the body of the electron microscope. It is to be noted that like components are indicated by like reference numerals in both FIGS. 1 and 2.

In FIG. 2, the envelope of the electron microscope is indicated by 22. A specimen chamber 24 is surrounded by the envelope 22. A specimen 23 is placed in the chamber 24. The protective container 9 is inserted in the specimen chamber 24. X-rays produced from the specimen 23 in response to an electron beam illuminating the specimen pass through the window 10 and are detected by the x-ray detector device 8. The specimen chamber 24 is designed to be evacuated by a vacuum pump 21. An exhaust pipe 18 communicating with the protective container 9 is inserted in the specimen chamber 24 which is evacuated by the vacuum pump 21. Indicated by 19 and 20 are exhaust valves. The operation of the pump 21 and the actuation of the exhaust valves 19, 20 are controlled by the control portion 15.

Also in this configuration, when the x-ray detector device 8 is not used as encountered when x-ray analysis is not performed, if the operation of the compressor 1 is stopped to stop the operation of the refrigerator, then the temperature of the adsorbent 5 rises, releasing gas into the space A.

It is assumed that the vacuum pump 21 is being operated under the control of the control portion 15 and that the exhaust valve 20 is opened. If an instruction for operating the x-ray detector is entered from the console portion 16, the control portion 15 first opens the exhaust valve 19, connecting the space A with the specimen chamber 24. As a result, the space A is started to be evacuated. If the control portion 15 finds from the output signal from the vacuum gauge 6 that the inside of the space A has reached a given degree of vacuum, the control portion closes the exhaust valve 19 and starts the operation of the compressor 1. Thus, the adsorbent 5 is cooled. The inside of the space A is then maintained at a given degree of vacuum.

While preferred embodiments of the invention have been described, it is to be understood that the invention is not limited to them but rather various changes and modifications are possible. In the above embodiments, a so-called window-type x-ray detector is used. The invention is not limited to this type. The invention can similarly be applied to a so-called windowless type x-ray detector. Also in the above embodiments, the compressor 1 of the refrigerator, the exhaust valve 12, and the vacuum pump 14 are controlled by the control portion 15. These may also be controlled manually. It is also possible to provide a display device such as a CRT which displays the degree of vacuum measured by the vacuum gauge 6. Alternatively, the display device provides a display of information indicating whether the x-ray detector device 8 can be used or not. Furthermore, those skilled in the art would take appropriate vibration-proof measures. For example, the compressor 1 or the head 2 is isolated by vibration-proof material such as rubber.

As can be understood from the description made thus far, in accordance with the present invention, the refrigerator is required to be run only when the x-ray detector device is in use. This reduces the running cost. Furthermore, components need to be replaced less frequently. It is not necessary that the adsorbent adsorb gas always. Since the gas released from the adsorbent is discharged to the outside by the pumping system, the life can be increased greatly.

Having thus described my invention with the detail and particularity required by the Patent Laws, what is desired and claimed to be protected by Letters Patent is set forth in the following claims.

What is claimed is:

1. An energy-dispersive x-ray detector comprising:
an x-ray detector device;
a refrigerator having a head on which adsorbent an is disposed;
a heat transfer rod disposed between the x-ray detector device and the head of the refrigerator;
a protective container in which the x-ray detector, the head of the refrigerator, and the heat transfer rod are housed;
a pumping system connected with the protective container via exhaust pipes and an exhaust valve; and
a control means for controlling the pumping system and the refrigerator such that when the x-ray detector device is not in use, the operation of the refrigerator is stopped and the inside of the protective container is evacuated by the pumping system, and such that when the x-ray detector device is in use, the refrigerator is operated.

2. The energy-dispersive x-ray detector of claim 1, wherein said pumping system evacuates the inside of the specimen chamber in an electron microscope in which the x-ray detector device is mounted.

3. A method of evacuating an energy-dispersive x-ray detector having an x-ray detector device, a refrigerator having a head containing an adsorbent, a heat transfer rod disposed between the x-ray detector device and the head of the refrigerator, a protective container housing the x-ray detector device, the head of the refrigerator, and the heat transfer rod, and a pumping system which is connected with the protective container via exhaust pipes and an exhaust valve, said method comprising the steps of:
stopping the operation of the refrigerator when the x-ray detector device is not in use; and
evacuating the inside of the protective container by the pumping system when the x-ray detector device is in use and then operating the refrigerator to maintain the vacuum created inside the protective container.

4. A method of evacuating an energy-dispersive x-ray detector having an x-ray detector device, a refrigerator having a head containing an adsorbent, a heat transfer rod disposed between the x-ray detector device and the head of the refrigerator, a protective container housing the x-ray detector device, the head of the refrigerator, and the heat transfer rod, exhaust pipes connecting the specimen chamber in an electron microscope with the protective container, and an exhaust valve, said method comprising the steps of:
stopping the operation of the refrigerator when the x-ray detector device is not in use; and
evacuating the inside of the protective container by a pumping system which also evacuates the inside of the specimen chamber in the electron microscope when the x-ray detector device is in use and then operating the refrigerator to maintain the vacuum created inside the protective container.

* * * * *

UNITED STATES PATENT AND TRADEMARK OFFICE
CERTIFICATE OF CORRECTION

PATENT NO. : 5,324,947
DATED : June 28, 1994
INVENTOR(S) : Eiichi Watanabe

It is certified that error appears in the above-indentified patent and that said Letters Patent is hereby corrected as shown below:

Title page, item [21] Appl. No., "986,688" should read --986,668--.

Title page, item [56] References Cited, U.S. PATENT DOCUMENTS, "4,230,945 10/1980 Mein et al. ... 250/370.15" should read --4,230,945 10/1980 Meir et al. ... 250/370.15--.

Column 1 Line 18 after "action" insert --of--.

Column 1 Line 21 after "adsorbent" insert --is--.

Column 1 Line 29 after "adsorbent" insert --.--.

Claim 1 Line 35 Column 5 "adsorbent an" should read --an adsorbent--.

Signed and Sealed this

Twentieth Day of September, 1994

Attest:

Attesting Officer

BRUCE LEHMAN

Commissioner of Patents and Trademarks